United States Patent
Michael et al.

(10) Patent No.: US 10,923,773 B2
(45) Date of Patent: Feb. 16, 2021

(54) CONTACTING UNIT FOR ELECTRICALLY CONTACTING AT LEAST ONE ELECTRONICS SEGMENT OF AN ELECTRONICS MODULE AND METHOD

(71) Applicant: TE Connectivity Germany GmbH, Bensheim (DE)

(72) Inventors: Mathias Michael, St. Leon-Rot (DE); Tobias Becker, St. Leon-Rot (DE)

(73) Assignee: TE Connectivity Germany GmbH, Bensheim (DE)

( * ) Notice: Subject to any disclaimer, the term of this patent is extended or adjusted under 35 U.S.C. 154(b) by 137 days.

(21) Appl. No.: 16/220,840

(22) Filed: Dec. 14, 2018

(65) Prior Publication Data
US 2019/0190084 A1 Jun. 20, 2019

(30) Foreign Application Priority Data
Dec. 14, 2017 (DE) .................. 10 2017 222 883

(51) Int. Cl.
*H05K 1/11* (2006.01)
*H01M 10/42* (2006.01)
(Continued)

(52) U.S. Cl.
CPC ............ *H01M 10/425* (2013.01); *H01B 7/08* (2013.01); *H01M 2/1077* (2013.01); *H01M 2/206* (2013.01); *H01M 10/482* (2013.01); *H05K 1/028* (2013.01); *H05K 1/118* (2013.01); *H01M 10/486* (2013.01); *H01M 2010/4271* (2013.01);
(Continued)

(58) Field of Classification Search
CPC ........ H05K 1/028; H05K 1/118; H05K 1/147; H01R 35/00; H01R 35/025; H01R 31/06; H01R 12/59; H01R 12/592; H01R 12/771; H01R 12/61
See application file for complete search history.

(56) References Cited

U.S. PATENT DOCUMENTS 4,065,199 A    12/1977    Andre et al.
5,250,758 A *  10/1993    Fjelstad ................. H01K 1/00
                                                                  174/254

(Continued)

FOREIGN PATENT DOCUMENTS

DE        19819088 A1    11/1999
EP         1153801 A2    11/2001
(Continued)

OTHER PUBLICATIONS

Extended European Search Report, European Patent Application No. 18212171.5, dated Mar. 26, 2019, 7 pages.
German Office Action, dated Aug. 9, 2018, 10 pages.

*Primary Examiner* — Tho D Ta
(74) *Attorney, Agent, or Firm* — Barley Snyder

(57) ABSTRACT

A contact unit for electrically contacting an electronic segment of an electronic module is provided. The contact unit generally includes a flexible substrate with a contact side. The contact side includes a module connector and a segment connector. The module connector includes a first unit terminal connected to a second unit terminal by a terminal conductor extending along a longitudinal axis thereof. The segment connector includes a first contact connected to the terminal conductor by a first contact conductor and a first fold of the flexible substrate.

18 Claims, 9 Drawing Sheets

(51) Int. Cl.
*H01M 10/48* (2006.01)
*H01B 7/08* (2006.01)
*H05K 1/02* (2006.01)
*H01M 2/10* (2006.01)
*H01M 2/20* (2006.01)
*H01R 12/61* (2011.01)
*H01R 35/00* (2006.01)
*H01R 12/77* (2011.01)
*H01R 35/02* (2006.01)
*H01R 12/59* (2011.01)
*H01R 31/06* (2006.01)

(52) U.S. Cl.
CPC .......... *H01R 12/59* (2013.01); *H01R 12/592* (2013.01); *H01R 12/61* (2013.01); *H01R 12/771* (2013.01); *H01R 31/06* (2013.01); *H01R 35/00* (2013.01); *H01R 35/025* (2013.01)

(56) References Cited

U.S. PATENT DOCUMENTS

| | | | |
|---|---|---|---|
| 6,702,607 B2 | 3/2004 | Kondo | |
| 2002/0051869 A1* | 5/2002 | Takahashi | G11B 33/1493 428/195.1 |
| 2005/0018102 A1 | 1/2005 | Hirano | |
| 2008/0310665 A1* | 12/2008 | Kuhtz | H04R 1/1058 381/375 |
| 2010/0118443 A1 | 5/2010 | Ohsawa et al. | |
| 2010/0331060 A1 | 12/2010 | Yoshida | |
| 2013/0161078 A1* | 6/2013 | Li | H05K 1/147 174/254 |
| 2014/0131071 A1* | 5/2014 | Tanaka | H05K 1/028 174/254 |
| 2014/0268538 A1* | 9/2014 | Newbert | H01R 31/06 361/679.33 |
| 2015/0289363 A1* | 10/2015 | Otsubo | H05K 1/0213 361/749 |
| 2017/0271642 A1 | 9/2017 | Groshert et al. | |
| 2019/0098751 A1* | 3/2019 | Koch | H05K 1/118 |

FOREIGN PATENT DOCUMENTS

| | | |
|---|---|---|
| EP | 2128912 A2 | 2/2009 |
| EP | 2290733 A1 | 3/2011 |
| EP | 2546906 A1 | 1/2013 |

* cited by examiner

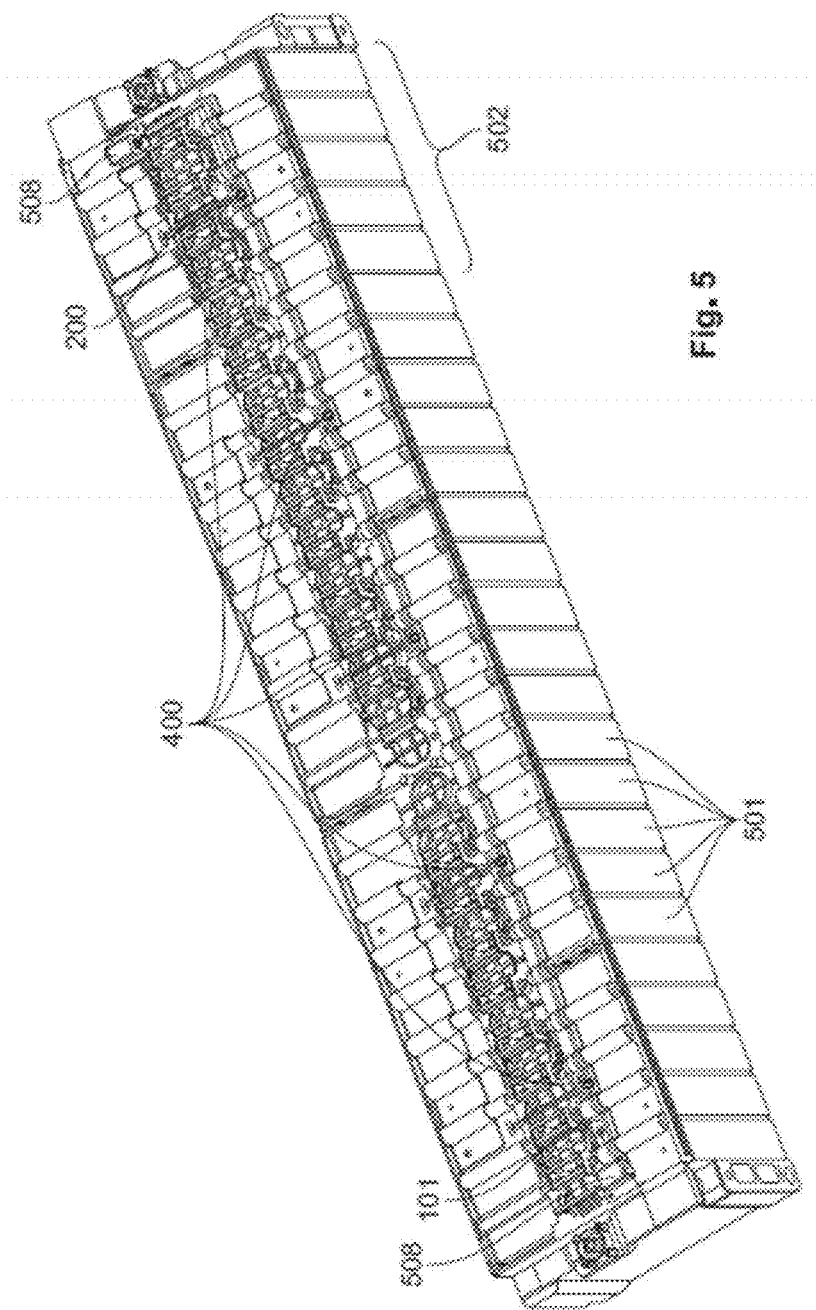

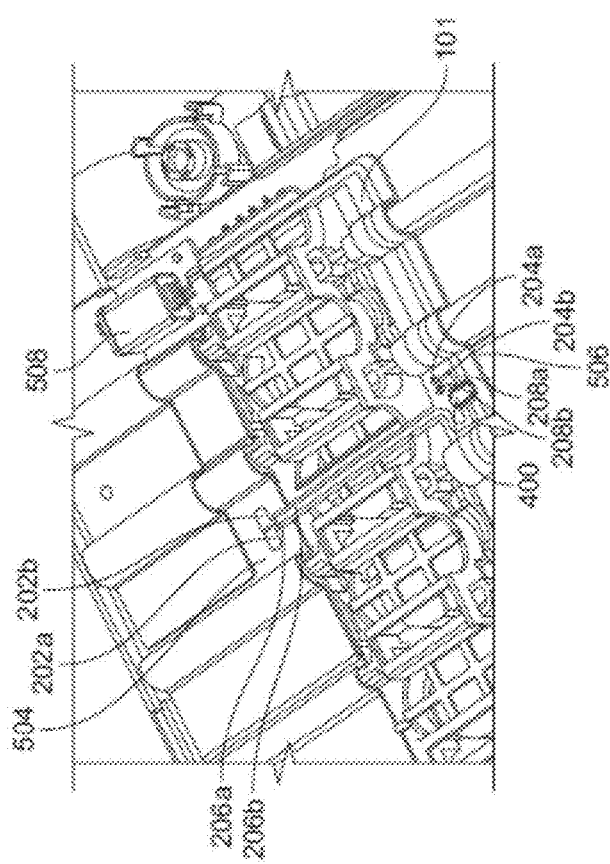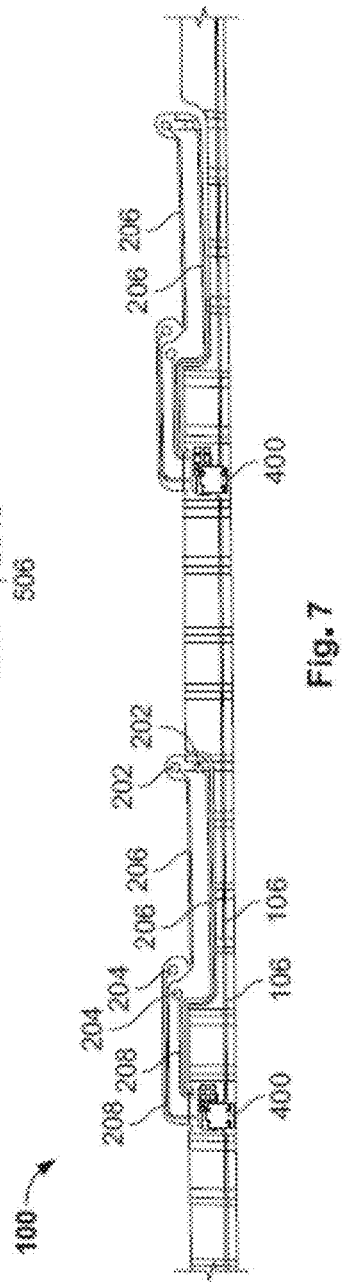

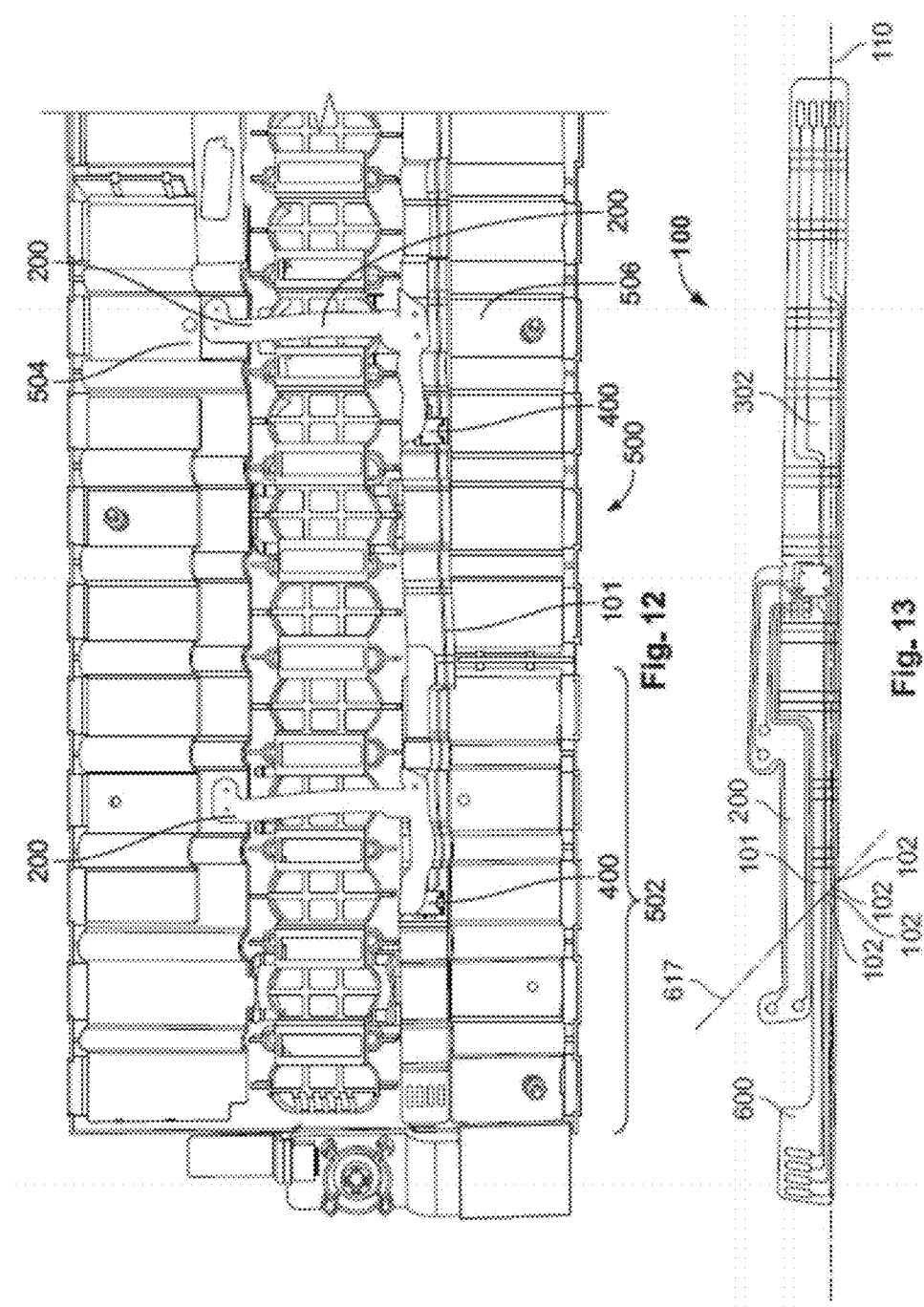

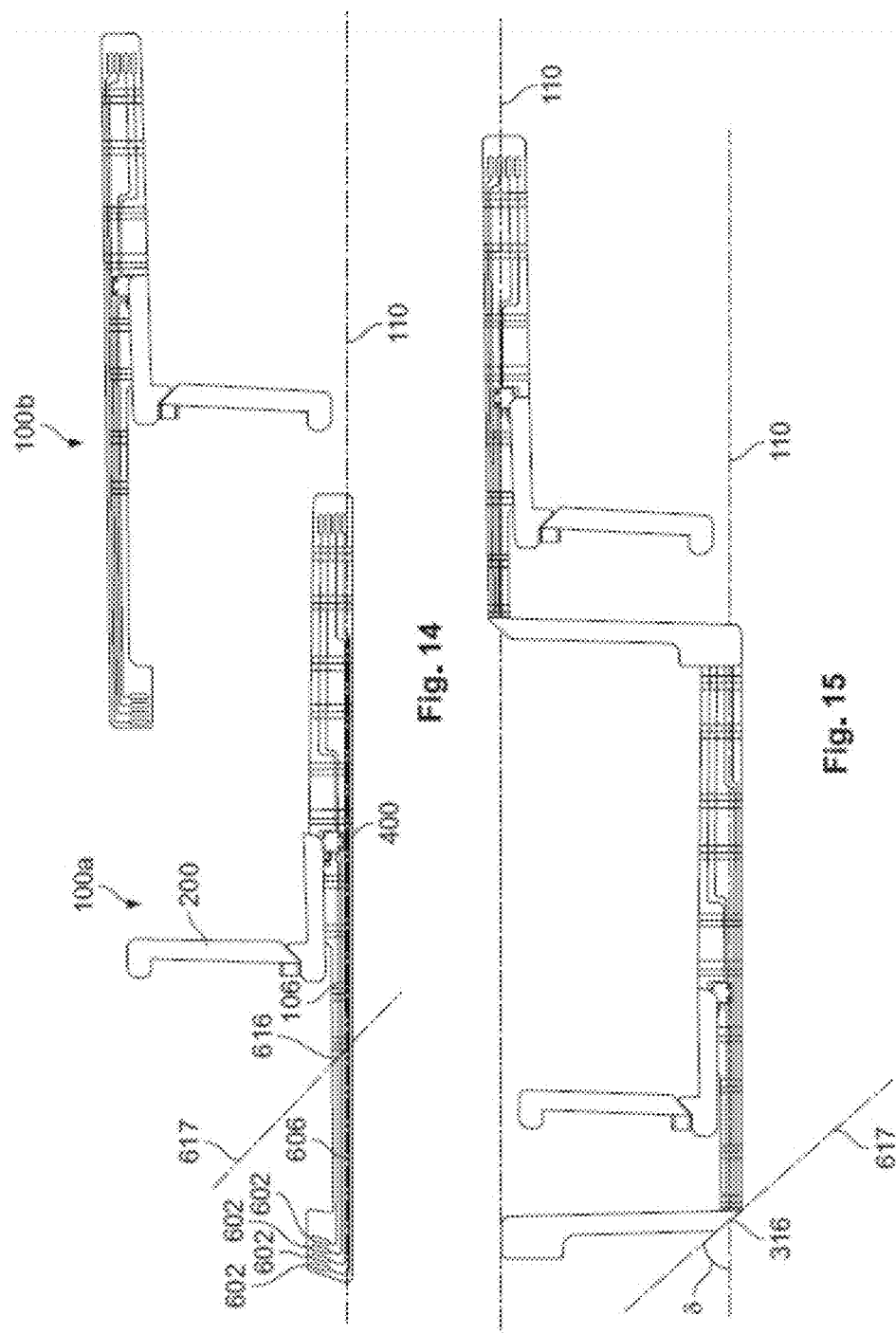

CONTACTING UNIT FOR ELECTRICALLY CONTACTING AT LEAST ONE ELECTRONICS SEGMENT OF AN ELECTRONICS MODULE AND METHOD

CROSS-REFERENCE TO RELATED APPLICATION

This application claims the benefit of the filing date under 35 U.S.C. § 119(a)-(d) of German Patent Application No. DE 102017222883.0, filed on Dec. 14, 2017.

FIELD OF THE INVENTION

The present invention relates to a contact unit and, more particularly, to a contact unit electrically connecting with an electronic segment of an electronic module.

BACKGROUND

Electrical components, such as battery cells, are often combined to form units.

With reference to FIG. 17, a known battery module 1500 is shown. The known battery module 1500 may be used, for example, with electric vehicles, such as plug-in, hybrid, or wholly electric vehicles. As shown, the known battery module 1500 generally consists of five battery segments 1502 that are connected in series. Each of these battery segments 1502 include five battery cells 1501 that are connected in parallel.

Each battery cell 1501 has a first terminal 1504, for example the positive pole, and a second terminal 1506, for example the negative pole. The first terminal 1504 and the second terminal may be manufactured from aluminum, for example.

As shown in FIG. 17, the terminals 1504, 1506 are electrically connected using connection plates, such that each of the battery cells 1501 are connected in parallel. One skilled in the art should appreciate that the same poles, i.e. in each case the positive and the negative poles, are connected to the battery cells 1501 of a battery segment 1502, in order to connect the battery cells 1501 of a battery segment 1502 in parallel.

Furthermore, the adjacent battery segments 1502 are connected in series. In particular, the positive pole of a first battery segment is connected to the negative pole of the adjacent second battery segment. Simultaneously, the negative pole of a first battery segment is electrically isolated from the positive pole of a second battery segment using a segment insulator 1508.

Furthermore, it may be necessary that each electronic segment of the electronic module be connected. For instance, in electric vehicles, it may be necessary for each battery segment 1502 of the battery module 1502 to be monitored using an electronic monitoring assembly.

As shown in FIG. 17, the known battery module 1500 includes a central terminal 1510 for connection to such an electronic monitoring assembly (not shown). The terminal 1510 contacts each battery segment 1502 using a first flat flexible cable 1512 and second flat flexible cable 1514. The flat flexible cables 1512 and 1514 are connected using a terminal connector 1516. When an electronic monitoring assembly having appropriate cabling is used, it is possible to monitor the temperature, the charging status and/or the integrity status, for example, of each battery segment 1502 for the known battery module 1500.

However, there is a need to improve the cabling used to make contact with the electronics units of an electronic module. In particular, there is a need to produce cabling that is cost-effective and avoids use of excess material.

SUMMARY

A contact unit for electrically contacting an electronic segment of an electronic module is provided. The contact unit generally includes a flexible substrate with a contact side. The contact side includes a module connector and a segment connector. The module connector includes a first unit terminal connected to a second unit terminal by a terminal conductor extending along a longitudinal axis thereof. The segment connector includes a first contact connected to the terminal conductor by a first contact conductor and a first fold of the flexible substrate.

BRIEF DESCRIPTION OF THE DRAWINGS

The invention will now be described by way of example with reference to the accompanying Figures, of which:

FIG. 5 is a perspective view of a battery module according to the invention;

FIG. 6 is a close up view of the battery module of FIG. 5;

FIG. 7 is a side view of another contact unit according to the invention;

FIG. 12 is a top view of another contact unit according to the invention, shown in connection with battery segments of a battery module;

FIG. 13 is a side view of the contact unit of FIG. 12;

FIG. 14 is a side view of a pair of contact units according to the invention;

FIG. 15 is a side view of a pair of contact units according to the invention, shown having four folds of the flexible substrate;

DETAILED DESCRIPTION OF THE EMBODIMENT(S)

Figure 1:
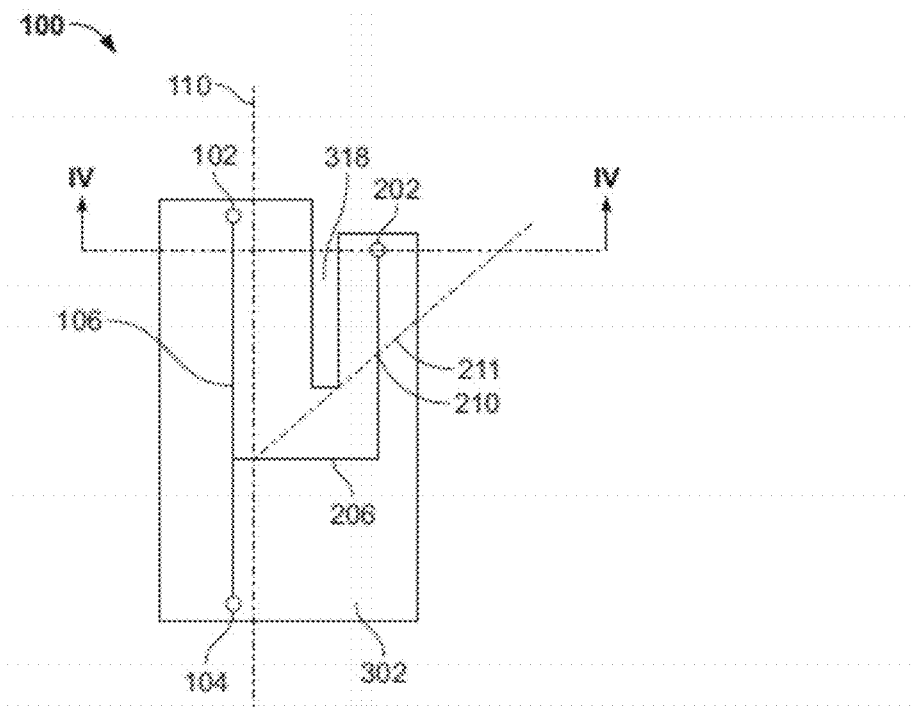
FIG. 1 is a front view of a contact unit according to the invention.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete, and will fully convey the concept of the invention to those skilled in the art.

Figure 17:
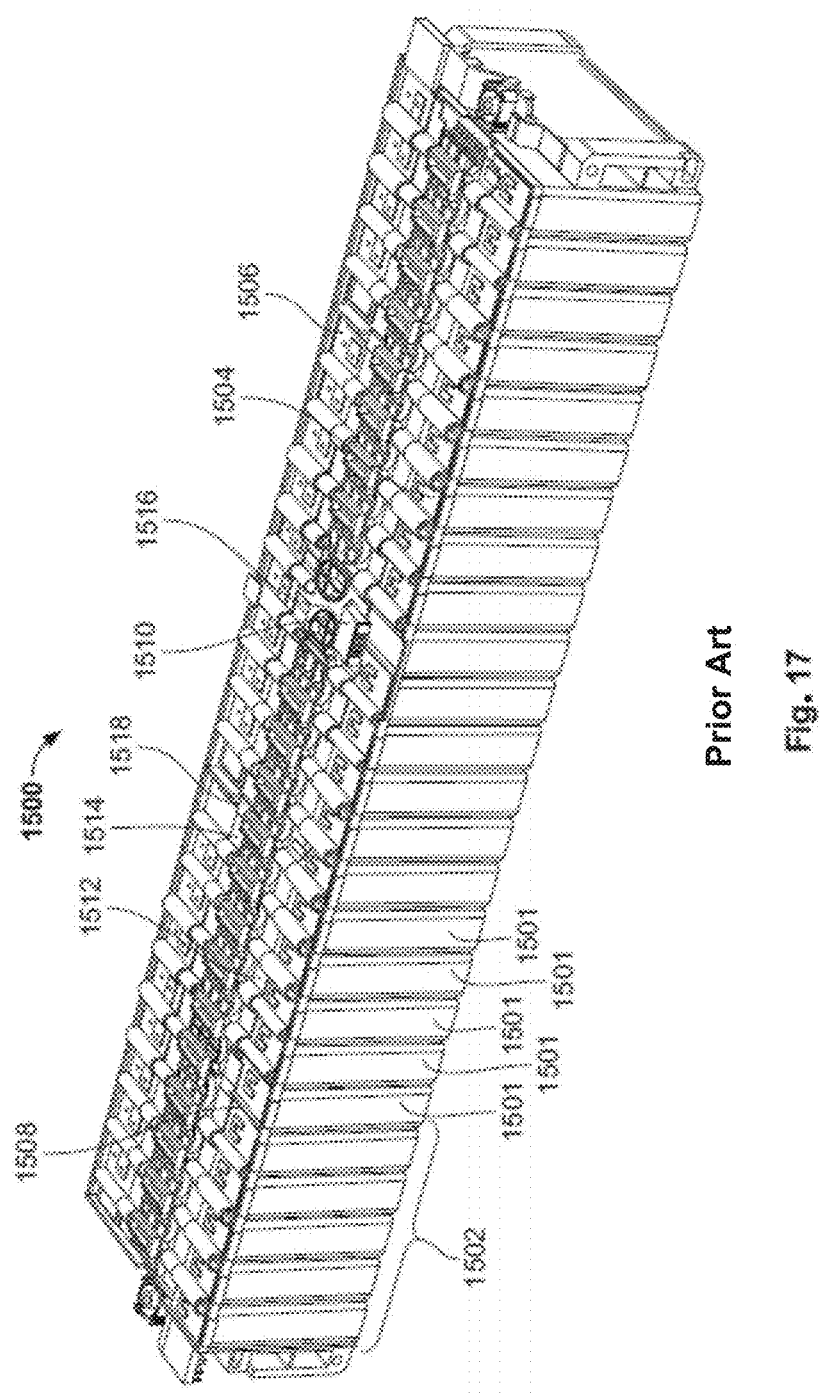
FIG. 17 is a perspective view of a known battery module.

With reference to FIG. 1 through, a contact unit 100 according to the invention is shown. For example, a contact unit 100 may be used to make contact with battery segments 1502 of a known battery module 1500, as shown in FIG. 17.

As shown, the contact unit 100 is made from a flexible substrate 300 that is a flat, unfolded substrate. The flexible substrate 300 can be, for example, a flexible printed circuit board (FPCB).

The contact unit 100 generally includes a module connector and a segment connector. In the shown embodiment, module connector includes a first unit terminal 102 and a second unit terminal 104 that are connected through a terminal conductor 106. In an embodiment of the invention, the terminal conductor 106 extends along a longitudinal axis 110 depicted by a dotted line in FIG. 1. The segment connector generally includes a first contact 202 that is connected to the terminal conductor 106 through a first contact conductor 206. A first folding region 210 is provided and positioned about a first folding axis 211 depicted by a dotted line in FIG. 1.

As shown in FIG. 1, the first contact conductor 206 extends along the longitudinal axis 110 at least in the region between the first folding region 210 and the first contact 202. Furthermore, the flexible substrate 300 includes a gap 318 positioned between the contact conductor 206 and the terminal conductor 106.

Figure 2:
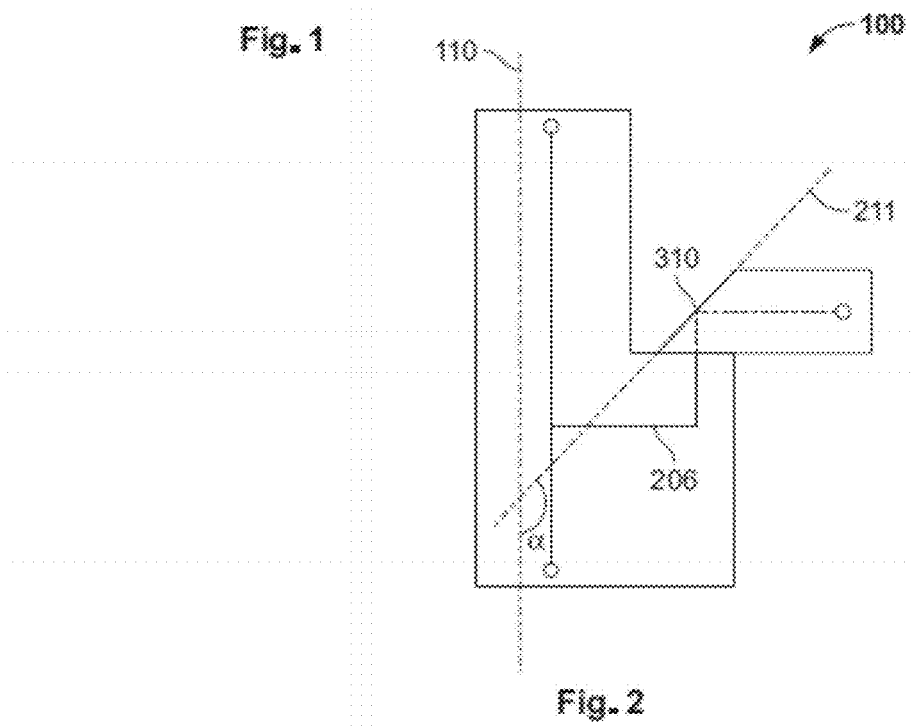
FIG. 2 is another front view of the contact unit of FIG. 1, showing a first fold along a first folding axis.

As shown in FIG. 2, the contact unit 100 further includes a first fold 310 that is provided when the segment connector is folded about the first folding axis 211 that forms an oblique angle α With reference to the longitudinal axis 110. In an embodiment of the invention, the oblique angle is 135°.

Figure 3:
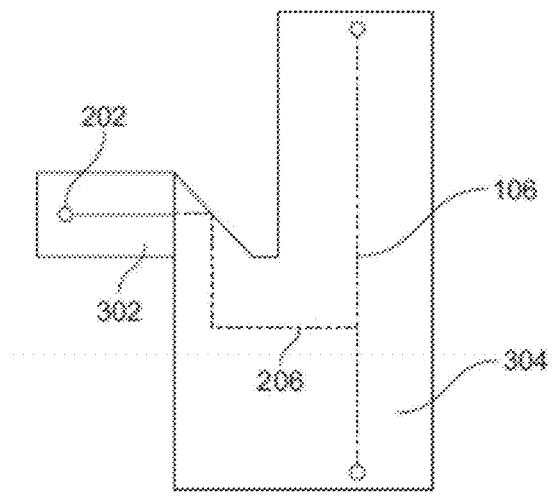
FIG. 3 is a rear view of the contact unit of FIG. 2.

With reference to FIG. 3, a second surface of the contact unit 100 is shown and includes a contact side 302 formed by the first fold 310 and having the first contact 202 for making contact with a first terminal of an electronic segment. The second surface also includes an insulation layer 304 generally in the region of the terminal conductor 106 and parts of the contact conductor 206 that are depicted by dotted lines in FIG. 3. In other words, the contact unit 100 can be connected to an electronic module in such a way that the terminal conductor 106 is electrically insulated from the electronic module by means of the insulation layer 304. Simultaneously, the first contact 202 can be electrically connected with the electronic segment of the electronic module.

Figure 4:
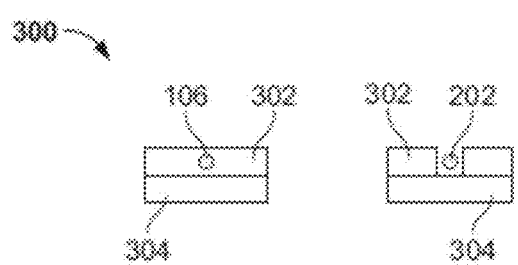
FIG. 4 is a sectional view of the contact unit of FIG. 1, taken along the line IV-IV.

With reference to FIG. 4, the contact side 302 and the insulation layer 304 are shown. The contact side 302 includes the module connector having the terminal conductor 106 and the segment connector having the first contact 202. By way of example, the contact side 302 can be created by a mask, which has a recess at least in the region of the first contact 202.

Even if this is not shown in FIGS. 1 to 4, the contact unit 100 according to the invention can have further segment connectors. Additionally or alternatively, the module connector may include a plurality of conductors, as is described in the following text with reference to FIGS. 5 and 6 and with reference to other embodiments of the invention. Additionally or alternatively, the segment connector may include a plurality of contacts, such as the segment connector 200, for example, shown in FIG. 6. In particular, each contact may be a pair of contact terminals in each case.

With reference to FIG. 5, a battery module 500 with battery segments 502 is shown, wherein each battery segment 502 includes of a plurality of battery cells 501. Here, the structure of the battery module 500 is for the most part the same as the known battery module 1500, which is described with reference to FIG. 17.

As shown, a monitoring unit 400 is provided for each of five battery segments 502 in the embodiment shown. Each monitoring unit 400 generally includes an evaluation unit and a communication unit and electrically connects with a battery segment 502 using a segment connector 200. The evaluation unit of the monitoring unit 400 evaluates measurement values that are measured using the segment connector 200. Thus, a set of parameters, for example the temperature, the charging status, or the integrity status of the respective battery segment 502, can be determined for each battery segment 502.

As shown in FIG. 5, each monitoring unit 400 includes a module connector 101 connected to a management unit 508 of the battery module 500 using at least one terminal 502 of the battery module 500. The monitoring unit 400 communicates with the management unit 508 using the module connector 101. In this way, for example, the parameters evaluated by the evaluation unit can be transferred.

Accordingly, fewer cables are required for the module connector 101 since control of the battery segments 502 is decentralized, because one monitoring unit 400 is used per battery segment 502. It should be appreciated by a person skilled in the art that, for the transfer of data, the module connector 101 must meet other requirements than the segment connector 200, which is used for determining measurement values. By way of example, the monitoring units 400 can be connected in a daisy chain using the module connector 101.

With reference to FIG. 6, a segment connector 200 according to the invention is shown. The segment connector 200 generally includes a first contact 202 and a second contact 204. The first contact 202 includes a pair of contact terminals 202a and 202b, each of the contact terminals 202a and 202b being connected to the monitoring unit 400 using a separate contact conductor 206a and 206b. The second contact 204 includes a pair of contact terminals 204a and 204b, each of the contact terminals 204a and 204b being connected to the monitoring unit 400 using a separate contact conductor 208a and 208b.

The first contact 202 is connected to a first terminal 504 of the battery segment 502. The second contact 204 is connected to a second terminal 506 of the battery element. The first terminal 504 is, for example, the positive pole of the battery segment 502 and the second terminal 506 is, for example, the negative pole of the battery segment 502.

As shown in FIG. 6, each pole of the battery segment 502 is connected by a pair of terminals. As a result, the parameters can be measured more accurately. By way of example, an impedance spectroscopy can be carried out for examining the battery segment 502. Furthermore, it is advantageous if the monitoring unit 400 measures the temperature of the battery segment 502 independently of the value of the impedance spectroscopy. In particular, a temperature measurement at the negative pole of the battery segment 502 is advantageous, since the temperature coupling is particularly good at the negative pole.

Using an evaluation unit, each monitoring unit 400 can evaluate parameters of the respective battery segment 502, and can communicate these to the management unit 508 of the battery module 500 using the module connector 101.

With reference to FIGS. 7 through 12, a contact unit 100 according to the invention is shown and used to make electrical contact with an electronic segment of an electronic module. For instance, FIG. 12 shows a contact unit 100 according to the invention that make contact with a battery segment 502 of a battery module 500.

As shown in the Figures, the contact unit 100 is substantially the same as the contact unit shown in FIGS. 1-4. Identical components are provided with identical reference signs. By way of example, the contact unit 100 may be used contacting battery segments 502 of the battery module 500 from FIG. 5. However, in contrast to the contact unit 100 of FIGS. 1-4, the flexible substrate 300 of the contact unit in FIGS. 7 through 12 is folded multiple times.

For instance, With reference to FIG. 7, a contact unit 100 according to an embodiment of the invention includes a module connector and two segment connectors. The contact unit 100 includes the same elements for making contacting with the electronic segment and the same elements for connection to the electronic module, like the contacting described with reference to FIGS. 5 and 6. In particular, the contact unit 100 includes a module connector having two terminal conductors 106. Moreover, the contact unit 100 includes two segment connectors. Each segment connector includes a first contact 202 and a second contact 204, wherein each of the contacts includes a pair of contact terminals. Each segment connector is connected to a monitoring unit 400. Each monitoring unit 400 is then connected to the terminal conductor 106 of the module connector. For further details about the module connector, the segment connector and the monitoring unit, reference is made to the description of FIGS. 5 and 6.

Figure 8:
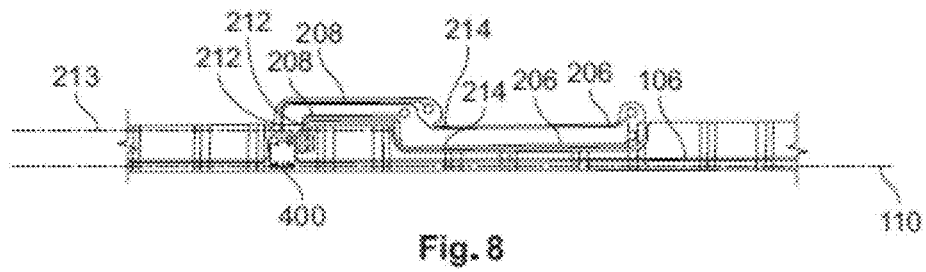
FIG. 8 is a close up view of contact unit of FIG. 7.
Figure 9:
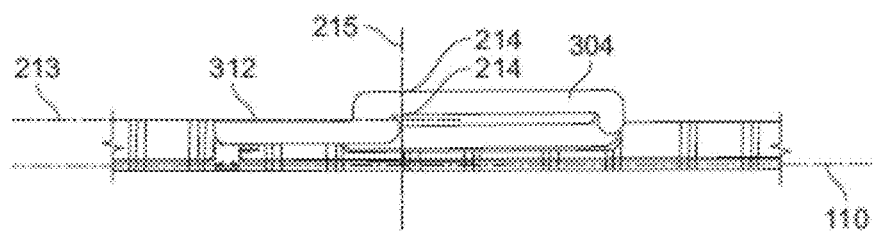
FIG. 9 is another close up view of the contact unit of FIG. 7, showing a second fold along a second folding axis.
Figure 10:
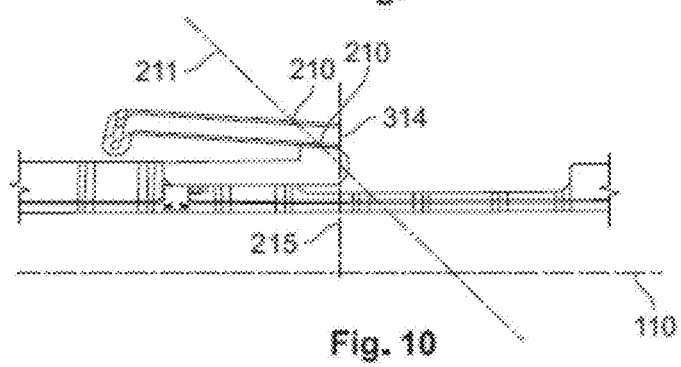
FIG. 10 is another close up view of the contact unit of FIG. 7, showing a third fold along a third folding axis.
Figure 11:
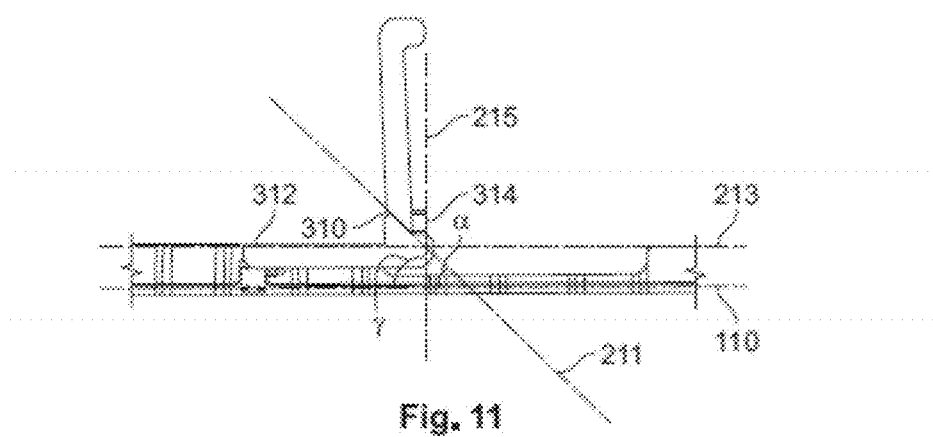
FIG. 11 is another close up view of the contact unit of FIG. 7, showing a first fold along a first folding axis.

With reference to FIG. 8, a region of the contact unit 100 with a segment connector is shown. FIGS. 9 to 11 show the individual steps of folding the contact unit 100.

FIG. 8 shows a contact side 302 of the flexible substrate having a module connector and a segment connector. In particular, FIG. 8 shows a flat, i.e. the unfolded, flexible substrate. The terminal conductor 106 extends in the direction of a longitudinal axis 110, which is depicted by dotted line in FIG. 8. The segment connector includes a pair of first contact conductors 206 and a pair of second contact conductors 208, which are connected to the terminal conductor 106 using the monitoring unit 400. Each of the first and second contact conductors 206 and 208 includes a second folding region 212 that is positioned about a second folding axis 213 depicted by another dotted line in FIG. 8.

FIG. 9 shows the contact unit 100 of FIG. 8, wherein the flexible substrate is folded. As shown, the segment connector includes a second fold 312, which extends along the second folding axis 213. In particular, the second fold 312 extends along the direction of the longitudinal axis 110. Furthermore, the contact unit 100 includes a third folding axis 215 depicted by another dotted line in FIG. 9. Each of the first and second contact conductors 206 and 208 includes a third folding region 214. In FIG. 9, the third folding region 214 is hidden by the insulation layer 304 of the flexible substrate.

FIG. 10 shows the contact unit 100 according to the invention, wherein the flexible substrate is folded twice. As shown, the segment connector includes the second fold 312, which extends along the second folding axis 213. In particular, the third fold 314 extends perpendicular to the direction of the longitudinal axis 110. Furthermore, the contact unit 100 includes a first folding axis 211, which is depicted by a dotted line in FIG. 10. Each of the first and second contact conductors 206 and 208 includes a first folding region 210.

FIG. 11 shows the contact unit 100 according to the invention, wherein the flexible substrate is folded three times. As shown, the segment connector includes a first fold 310 extending along the first folding axis 211 and forms an oblique angle α of 45° with the longitudinal axis 110. The second folding axis 213 includes a second fold 312 that extends along the first longitudinal axis 110. The third folding axis 215 includes a third fold 314 that forms a right angle γ of 90° with the longitudinal axis 110.

FIG. 12 shows the contact unit 100 according to the invention making contact with battery segments 502 of a battery module 500. Each segment connector 200 electrically connects with a first terminal 504 and a second terminal 506 of a battery segment 502. Each segment connector 200 is connected to the module connector 101 using a monitoring unit 400.

With reference to FIGS. 13 to 16, another contact unit 100 according to the invention is shown and used to make electrical contact with an electronic segment of an electronic module. The shown contact unit 100 is substantially the same as the contact unit of FIGS. 1-4 and 7-12. For sake of brevity, identical components are provided with identical reference symbols. However, in contrast to those designs, the contact unit 100 in FIG. 16, for example, makes it possible for the module connector 101 to be positioned at the negative pole, i.e. therefore either at the first terminal 504 or at the second terminal 506 of the battery segment 502. Thus the monitoring unit 400, for example, which contains an additional temperature sensor, of each contact unit 100 can be positioned at the negative pole of the battery segment 502. This is advantageous, in particular, as the thermal coupling at the negative pole of the battery segment 502 is particularly good.

With reference to FIG. 13, a contact side 302 of a contact unit 100 according to another embodiment of the invention is shown. The contact unit 100 includes a module connector 101, a segment connector 200 and additionally an arm connector 600. The module connector 101 and the segment connector 200 are substantially the same as the module connector and the segment connector of the embodiment shown in FIGS. 8-11. In particular, each of the first unit terminals 102 of the module connector 101 is connected in each case to a linkage arm conductor 606 of the arm connector 600 in the region of the fourth folding axis 617 depicted as a dotted line in FIG. 13.

FIG. 14 shows two contact units 100 according to the invention, wherein the segment connector 200 is folded in accordance with the embodiment described with reference to FIGS. 8 to 11. In particular, FIG. 14 shows a flat, i.e. the unfolded, flexible substrate of the arm connector and of the module connector. The arm connector includes four linkage arm terminals 602, which are connected to the monitoring unit 400 by in each case a linkage arm conductor 606 using in each case a terminal conductor 106. Each linkage arm conductor 606 extends in the direction of the longitudinal axis 110 depicted by a dotted line in FIG. 14. Each terminal conductor 106 is connected to a linkage arm conductor 606 in the region of the fourth folding axis 617 also depicted by a dotted line in FIG. 14, in a fourth folding region 616. It should be understood by a person skilled in the art that the present connection is not limited to four connection terminals 602.

FIG. 15 shows two contact units 100 in accordance with the invention, wherein the flexible substrate is folded four times. The flexible substrate is folded three times, as shown in FIG. 11. Additionally, the flexible substrate is folded a fourth time. As shown, the arm connector includes a fourth fold 316 that extends along a fourth folding axis 617. In particular, the fourth folding axis 617 forms an oblique angle δ of 45° with the longitudinal axis 110.

Furthermore, FIGS. 14 and 15 show a contacting system that includes a first contact unit 100a and a second contact unit 100b. It should be understood by a person skilled in the art that the contacting system may also include contact units 100 of the aforementioned designs, including those shown in FIGS. 1-4 and 8-11.

Figure 16:
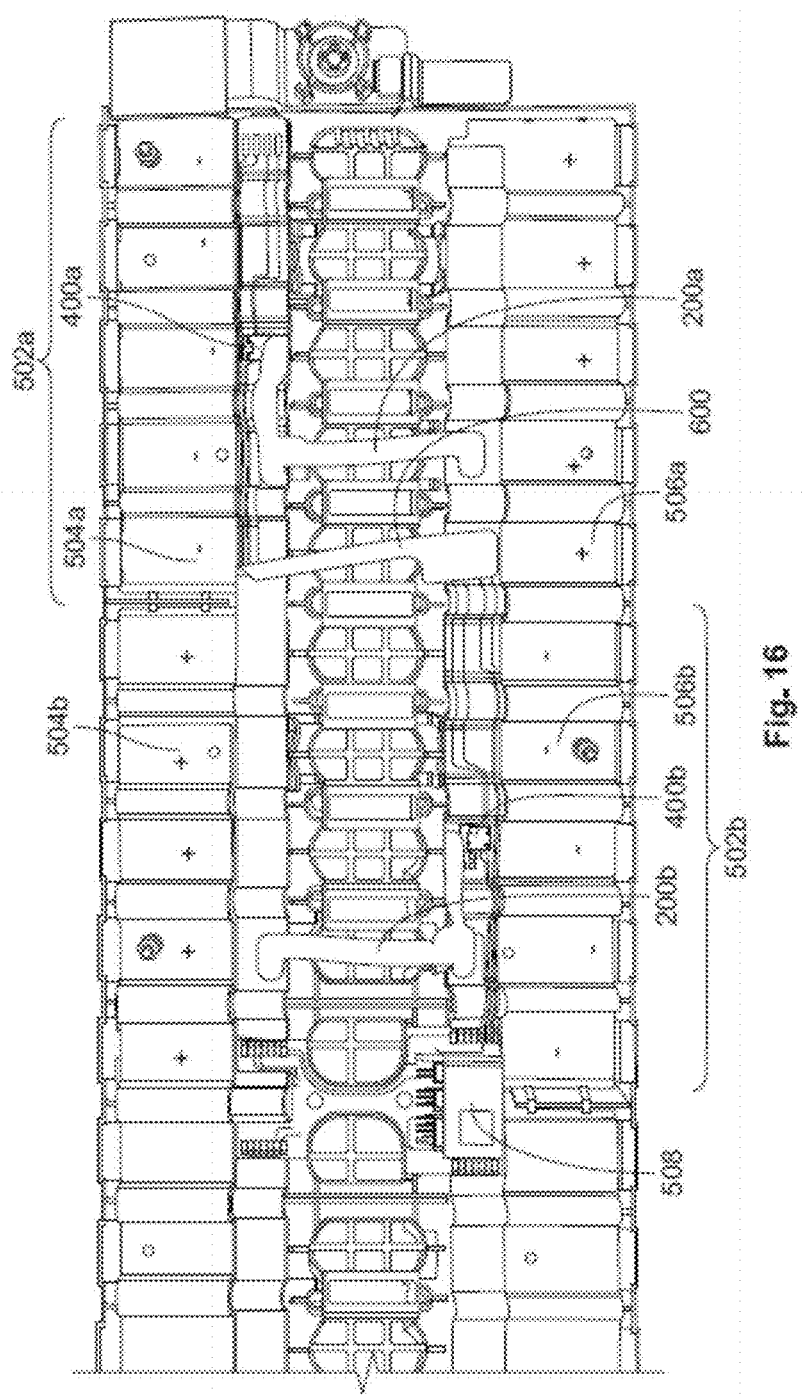
FIG. 16 is a top view of contacting system having contact units according to the invention that contact battery of a known battery module.

FIG. 16 shows another contact unit 100 according to the invention that is for electrically contacting a battery segment 502 of a battery module 500. The battery module 500 shown in FIG. 16 corresponds to the battery module 500 from FIGS. 5 and 12.

FIG. 16 shows a contacting system that includes two contact units 100a and 100b that contact the battery segments 502 of a battery module 500. As a result of the series connection of the battery segments 502, the polarity of adjacent battery segments reverses. For example the first terminal 504 of the first battery segment 502a is a first negative pole 504a and the second terminal of the first battery segment 502a is a first positive pole 506a. Accordingly, the first terminal 504 of the second battery segment 502b is a positive pole 504b and the second terminal 506 of the second battery segment 502b is a negative pole 506b.

Each module connector 101a and 101b contacts in each case the negative pole 504a and 506b of a battery segment 502a and 502b. In particular, the monitoring unit 400a and 400b contacts the negative pole 504a and 506b. Furthermore, each segment connector 200a and 200b contacts a first terminal 504 and a second terminal 506 of each battery segment 502. Each segment connector 200a and 200b is connected to the module connector 101a and 101b using a monitoring unit 400a and 400b. The module connector 101a of the first contact unit 100a is connected to the module connector 101b of the second contact unit 100b using a first arm connector 600. The module connector 101b of the second contact unit 100b is connected to a terminal for a management unit 508.

The contact unit 100 of the present invention can be manufactured in a simple and material-saving manner. The present invention may be used to make contact with electronic segments of an electronic module. By folding a flexible substrate, the contactable surface area can be enlarged. In this way, the contact unit 100 according to the invention can be manufactured as a narrow strip having a predetermined length l and a small width b. Using the aforementioned folding techniques, the contact surface area is not limited by a small width b. Rather, the contact unit 100 according to the invention may be used to contacting electronic segments of an electronic module, such as battery segments of a battery module, and in particular in electrically driven vehicles to monitor the individual battery segments.

A contact unit 100 according to the invention may be manufactured using less material, since the contact surface area is increased by folding of the flexible substrate 300. In particular, such a contact unit 100 can be manufactured as a narrow strip having a small width b. The flexible substrate 300 is selected for the base material of the strip. The elements for contacting the electronic segment and the elements for connection to the electronic module are applied to the flexible substrate 300. In the process, the narrow strip extends in the direction of the connection conductor. Furthermore, the flexible substrate 300 is folded in such a way that the surface contacted by the contact unit 100 is enlarged. In particular, the width b' of the contact unit 100 is greater than the width b of the narrow strip. In other words, the fold, which is produced by the folding of the flexible substrate 300, forms an oblique angle with the longitudinal axis 110.

It should be understood by one person skilled in the art that every oblique angle, i.e. every acute or obtuse angle, or put another way, every angle that is not a multiple of 90°, leads to an enlargement of the contact surface area of the contact unit 100.

Further, it should be understood by one person skilled in the art that the module connector 101 may include a plurality of connection conductors, each having a first and second terminal. Furthermore, the module connector 101 can be connected to the electronic module directly or indirectly, for example using an intermediate element. Advantageously, the module connector 101 is designed for data communication.

Furthermore, the manufacturing of the contact unit 100 according to the invention is cost-effective, since only the contact side 302 of the flexible substrate 300 has electrical contacts, whereas an opposing surface of the flexible substrate 300 can be formed as an insulator. By folding of flexible substrate 300, both opposing surfaces of the contact unit 100 can have electrical contacts. It should be understood by person skilled in the art that the contact unit 100 can only have contacts on opposing surfaces if the number of folds is odd.

By folding the flexible substrate 300, the contact unit 100 can thus be manufactured, for example, in a layer process. In particular, the flexible substrate 300 can have an insulation layer 304, on which a contacting layer is applied. Furthermore, an insulating mask can be applied to the contacting layer such that the insulating mask has recesses in the region of the contacts. Using such a manufacturing method, by the building-up of layers, is particularly cost-effective and precise.

In accordance with an advantageous embodiment, the contact unit 100 further includes a monitoring unit 400, wherein the first contact conductor of the at least one segment connector 200 is connected to the connection conductor through the monitoring unit 400. This makes it possible for the segment connector 200 and the module connector 101 to take on various tasks, for example data communication or measurement of data. In particular, the monitoring unit 400 can also be formed as a control unit.

It is particularly advantageous if the at least one monitoring unit 400 includes a communication unit and/or an evaluation unit. Thus, the segment connector 200 can be used for recording data, for example.

In addition, or alternatively, the module connector 101 can be adapted to communicate with a management unit 508 of the electronic module. Thus, the module connector 101 can be formed as a daisy chain, for example.

According to an embodiment of the invention, the segment connector 200 includes a second contact for contacting a second terminal of the electronic segment, wherein the second contact is connected to the connection conductor using a second contact conductor that includes a second bending region. In particular, it is advantageous if the second contact is adapted to electrically contact a second pole of the electronic segment. According to one embodiment, the first fold 310 includes the second bending region. According to another embodiment, the first fold 310 does not includes the second bending region. Using a second contact, additional properties, such as the voltage, of the electronic segment for example, can be measured, or properties such as the temperature of the electronic segment, for example, can be measured more accurately. Moreover, a current can be conducted through the electronic segment by way of the second contact, in order to measure the properties of the electronic segment.

According to the invention, each of the first and second contacts may include a pair of contact terminals. Thus, it is possible to increase the accuracy when monitoring the electronic segment, for example using an impedance spectroscopy.

In another embodiment of the invention, the contact side 302 includes an arm connector. The arm connector includes a linkage arm terminal for connection to the electronic module and is connected to one of the terminals of the module connector 101 through a linkage arm conductor that makes up a fourth bending region. A fourth angle is provided between a fourth fold 316 of the flexible substrate 300 along a fourth bending region and the longitudinal axis 110 is oblique. Thus, it is possible, for example, for the monitoring unit 400 to be arranged at identical poles of battery segments connected in series. In particular, thermal coupling at the negative pole of a battery cell is ideal. Thus, it is particularly advantageous to position the monitoring unit 400, having an additional temperature sensor, at the negative pole of a battery segment 502.

The foregoing illustrates some of the possibilities for practicing the invention. Many other embodiments are possible within the scope and spirit of the invention. The disclosed invention utilizes the above identified components, as a system, in order to more efficiently construct a contact unit 100 for a particular purpose. Therefore, more or less of the aforementioned components can be used to conform to that particular purpose. It is, therefore, intended that the foregoing description be regarded as illustrative rather than limiting, and that the scope of the invention is given by the appended claims together with their full range of equivalents.

What is claimed is:

1. A contact unit comprising:
a flexible substrate with a contact side having a module connector having a first unit terminal connected to a second unit terminal by a terminal conductor extending along a longitudinal axis thereof, and a segment connector having a first contact connected to the terminal conductor by a first contact conductor and a first fold of the flexible substrate, the first fold extends along a first folding axis that is formed at an oblique angle α with respect the longitudinal axis, the first contact electrically connects with a first electrical terminal of an electronic segment of an electronic module, the segment connector includes a second contact for contacting a second terminal of the electronic segment.

2. The contact unit of claim 1, further comprising a management unit communicating with the module connector.

3. The contact unit of claim 1, wherein the segment connector electrically connects with a pole of an electronic segment of an electronic module.

4. The contact unit of claim 1, further comprising a monitoring unit connecting the first contact conductor to the terminal conductor.

5. The contact unit of claim 4, wherein the monitoring unit includes a communication unit.

6. The contact unit of claim 5, wherein the monitoring unit includes an evaluation unit.

7. The contact unit of claim 1, wherein the second contact is connected to the terminal conductor through a second contact conductor.

8. The contact unit of claim 7, wherein each of the first contact and the second contact includes a pair of contact terminals.

9. The contact unit of claim 7, wherein the segment connector includes a second fold of the flexible substrate that extends along a second folding axis parallel to the longitudinal axis.

10. The contact unit of claim 9, wherein the first contact conductor includes a third fold along a third folding axis that extends perpendicular to the longitudinal axis.

11. The contact unit of claim 10, wherein the contact side includes an arm connector.

12. The contact unit of claim 11, wherein the arm connector includes a linkage arm terminal connecting to the electronic module.

13. The contact unit of claim 12, wherein the linkage arm terminal connects to one of the first unit terminal or the second unit terminal using a linkage arm conductor.

14. The contact unit of claim 13, wherein the linkage arm conductor includes a fourth fold of the flexible substrate.

15. The contact unit of claim 14, wherein the fourth fold is positioned along a fourth folding axis that forms an oblique angle δ of 45° with the longitudinal axis.

16. A contact unit comprising:
a flexible substrate with a contact side having a module connector having a first unit terminal connected to a second unit terminal by a terminal conductor extending along a longitudinal axis thereof, and a segment connector having a first contact connected to the terminal conductor by a first contact conductor and a first fold of the flexible substrate, the first fold extends along a first folding axis that is formed at an oblique angle α with respect the longitudinal axis; and
a monitoring unit connecting the first contact conductor to the terminal conductor.

17. The contact unit of claim 16, wherein the monitoring unit includes a communication unit.

18. The contact unit of claim 17, wherein the monitoring unit includes an evaluation unit.

* * * * *